US010527234B2

United States Patent
Wegner (10) Patent No.: US 10,527,234 B2
(45) Date of Patent: Jan. 7, 2020

(54) LIGHTING SYSTEM INCORPORATING CHIP SCALE PACKAGE LIGHT EMITTING DIODES

(71) Applicant: Cooper Technologies Company, Houston, TX (US)

(72) Inventor: Scott David Wegner, Peachtree City, GA (US)

(73) Assignee: Eaton Intelligent Power Limited, Dublin (IE)

( * ) Notice: Subject to any disclaimer, the term of this patent is extended or adjusted under 35 U.S.C. 154(b) by 7 days.

(21) Appl. No.: 15/868,839

(22) Filed: Jan. 11, 2018

(65) Prior Publication Data
US 2018/0195674 A1    Jul. 12, 2018

Related U.S. Application Data

(60) Provisional application No. 62/444,996, filed on Jan. 11, 2017.

(51) Int. Cl.
| | |
|---|---|
| *F21K 9/62* | (2016.01) |
| *F21V 19/00* | (2006.01) |
| *H01L 33/62* | (2010.01) |
| *H01L 25/075* | (2006.01) |
| *H01L 33/58* | (2010.01) |
| *F21V 8/00* | (2006.01) |
| *F21Y 105/16* | (2016.01) |
| *F21Y 115/10* | (2016.01) |

(52) U.S. Cl.
CPC ............ *F21K 9/62* (2016.08); *F21V 19/0015* (2013.01); *G02B 6/0051* (2013.01); *G02B 6/0068* (2013.01); *H01L 25/0753* (2013.01); *H01L 33/62* (2013.01); *F21Y 2105/16* (2016.08); *F21Y 2115/10* (2016.08); *H01L 33/58* (2013.01)

(58) Field of Classification Search
CPC .. G02B 19/0009–0014; G02B 19/0061; G02B 6/0005–001; G02B 19/0047–0071; H01L 33/52–60; H01L 25/075–0753; F21K 9/64; F21K 9/69; F21V 5/00; F21V 5/007; F21V 5/008; F21V 5/02; F21V 5/04; F21V 5/048; F21V 7/0091; F21Y 2105/10–16
See application file for complete search history.

(56) References Cited

U.S. PATENT DOCUMENTS

| | | | | |
|---|---|---|---|---|
| 8,172,443 | B2 * | 5/2012 | Suehiro | H01L 33/54 362/245 |
| 8,174,036 | B2 * | 5/2012 | Blumel | G02B 27/0955 257/100 |
| 9,086,211 | B2 * | 7/2015 | Duong | A01G 7/045 |
| 2007/0263383 | A1 * | 11/2007 | Ansems | G02B 6/002 362/231 |
| 2008/0037271 | A1 * | 2/2008 | Grace | G02B 1/06 362/551 |

(Continued)

*Primary Examiner* — Mariceli Santiago
(74) *Attorney, Agent, or Firm* — King & Spalding LLP (57) ABSTRACT

A lighting system includes a chip scale package light emitting diode mounted to a substrate and covered by an optic. The chip scale package light emitting diode has six faces with the top face and the four side faces operative to emit light and the bottom face oriented toward the substrate. The optic includes a lower face with a cavity in which the chip scale package light emitting diode is at least partially disposed.

14 Claims, 6 Drawing Sheets

(56) References Cited

U.S. PATENT DOCUMENTS

| | | | |
|---|---|---|---|
| 2008/0043466 A1* | 2/2008 | Chakmakjian | F21V 5/007 362/237 |
| 2008/0062686 A1* | 3/2008 | Hoelen | G02B 6/002 362/240 |
| 2014/0117391 A1* | 5/2014 | Ha | H01L 33/58 257/98 |
| 2016/0201875 A1* | 7/2016 | Kang | G02B 19/0014 362/311.06 |

* cited by examiner

LIGHTING SYSTEM INCORPORATING CHIP SCALE PACKAGE LIGHT EMITTING DIODES

RELATED APPLICATIONS

The present application claims priority to U.S. Provisional Patent Application No. 62/444,996, titled "Lighting System Incorporating Chip Scale Package Light Emitting Diodes," and filed on Jan. 11, 2017, the entire contents of which are incorporated herein by reference.

TECHNICAL FIELD

Embodiments of the technology relate generally to illumination systems and more particularly to a lighting system that manages light from chip scale packages of light emitting diodes (LEDs).

BACKGROUND

For illumination applications, light emitting diodes offer substantial potential benefits associated with their energy efficiency, light quality, and compact size. However, to realize the full potential benefits offered by light emitting diodes, new technologies are needed.

For instance, there are needs in the art for managing light emitted by light emitting diodes that are configured in a chip scale package (CSP). Such need includes processing the emitted light from one or more chip scale package light emitting diodes in a manner that provides homogenous illumination. Such need further includes capturing light emitted from a side surface of a chip scale package light emitting diode and utilizing the captured light to provide illumination.

A capability addressing one or more such needs, or some other related deficiency in the art, would support improved illumination systems and more widespread utilization of light emitting diodes in lighting applications.

SUMMARY

The present disclosure describes a lighting system incorporating chip scale package light emitting diodes. In one embodiment, a lighting system comprises a two-dimensional array of light emitting diodes mounted to a substrate, wherein each of the light emitting diodes has a cuboid or block shape comprising six faces. The lighting system further comprises an optic that comprises a two-dimensional array of cavities and that is mounted to the substrate with each light emitting diode disposed in a respective one of the cavities.

In another embodiment, a lighting system comprises a chip scale package light emitting diode mounted on a substrate and covered by an optic. The chip scale package light emitting diode comprises a bottom face oriented towards the substrate, a top face oriented away from the substrate and operative to emit light, and four side faces extending between the top face and the bottom face and operative to emit light. The optic comprises an upper surface oriented away from the substrate, a lower surface oriented towards the substrate, and a cavity that is formed in the lower surface and in which the chip scale package light emitting diode is at least partially disposed. The lower surface of the optic comprises a peripheral area that extends peripherally about the cavity, that is undercut, and that is oriented to receive light rays emitted from the four side faces of the chip scale package light emitting diode and to totally internally reflect the received light rays toward the upper surface of the optic.

In yet another embodiment, a lighting system comprises a chip scale package light emitting diode mounted on a substrate and covered by an optic. The chip scale package light emitting diode comprises a bottom face oriented towards the substrate, a top face oriented away from the substrate and operative to emit light, and four side faces extending between the top face and the bottom face and operative to emit light. The optic comprises a flat upper surface oriented away from the substrate, a lower surface oriented towards the substrate, a cavity that is formed in the lower surface, wherein the chip scale package light emitting diode is at least partially disposed in the cavity, and four flat side faces that extend from the upper flat surface toward the lower surface. A first portion of the optic lower surface adjoins the substrate and extends peripherally around the cavity. A second portion of the lower surface rises from the first portion of the lower surface and meets the four flat side faces in a corner that extends peripherally around the cavity.

These and other aspects, objects, features, and embodiments will be apparent from the following description and the appended claims.

BRIEF DESCRIPTION OF THE FIGURES

The drawings illustrate only example embodiments of methods, systems, and devices for lighting systems using chip scale package light emitting diodes and are therefore not to be considered limiting in scope, as they may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

DETAILED DESCRIPTION OF EXAMPLE EMBODIMENTS

In some example embodiments as described herein, a lighting system can comprise an optic that captures light emitted from a side surface of a light emitting diode, for example a chip scale package light emitting diode, and that processes the captured light to provide illumination. In some example embodiments as described herein, a lighting system can comprise an optic that captures light emitted from multiple light emitting diodes, for example multiple chip scale package light emitting diodes, and processes the captured light to provide illumination. A chip scale package light emitting diode is defined by IPC's standard J-STD-012, Implementation of Flip Chip and Chip Scale Technology, as a type of integrated circuit package that is directly surface mountable, has an area no greater than 1.2 times that of the die (the light emitting diode), and has a single LED.

Figure 1:
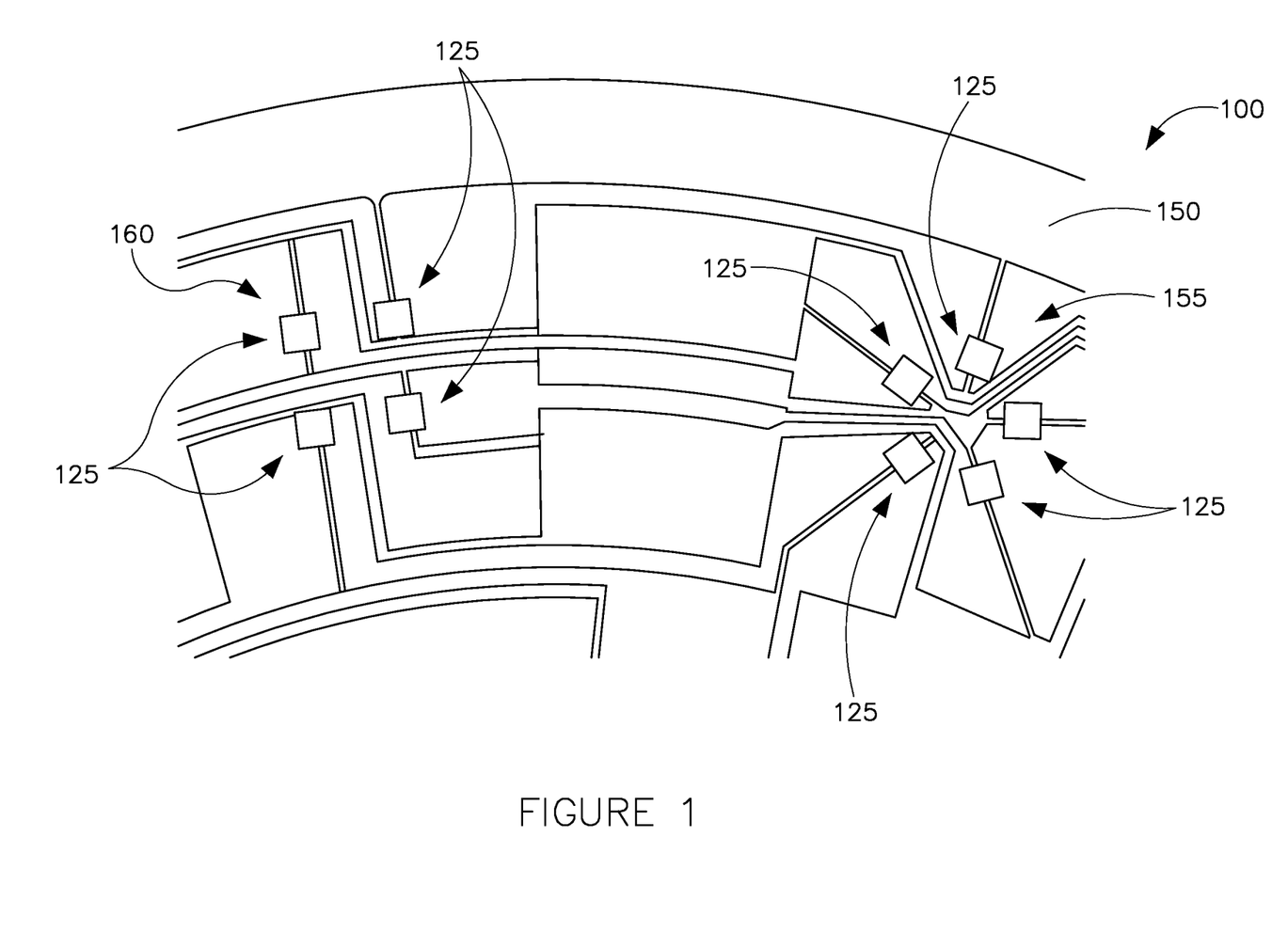
FIG. 1 illustrates example chip scale package light emitting diodes mounted on a substrate in accordance with an example embodiment of the disclosure.

Some representative embodiments will be described more fully hereinafter with example reference to the accompanying drawings that illustrate embodiments of the technology. The technology may, however, be embodied in many different forms and should not be construed as limited to the embodiments set forth herein; rather, these embodiments are provided so that this disclosure will be thorough and complete, and will fully convey the scope of the technology to those appropriately skilled in the art. FIG. 1 illustrates example chip scale package light emitting diodes mounted to an example substrate. FIGS. 2, 3, and 4 respectively illustrate three example lighting systems that utilize optics for managing light emitted by chip scale package light emitting diodes.

The drawings illustrate only example embodiments and are therefore not to be considered limiting of the embodiments described, as other equally effective embodiments are within the scope and spirit of this disclosure. The elements and features shown in the drawings are not necessarily drawn to scale, emphasis instead being placed upon clearly illustrating principles of the embodiments. Additionally, certain dimensions or positionings may be exaggerated to help visually convey certain principles. In the drawings, similar reference numerals among different figures designate like or corresponding, but not necessarily identical, elements.

Turning now to FIG. 1, an apparatus 100 is illustrated that comprises two arrays 160, 155 of chip scale package light emitting diodes 125 mounted to a substrate 150 in accordance with some example embodiments of the disclosure. In the illustrated embodiment, the substrate 150 comprises a circuit board that has a white coating for reflecting light emitted by the chip scale package light emitting diodes 125 that is incident upon the circuit board. The circuit board can comprise electrical paths or traces for supplying electricity to the chip scale package light emitting diodes 125. As further discussed below with respect to FIGS. 2, 3, and 4, optics can be mounted on the substrate 150 to process light emitted by the chip scale package light emitting diodes 125.

Figure 2A:
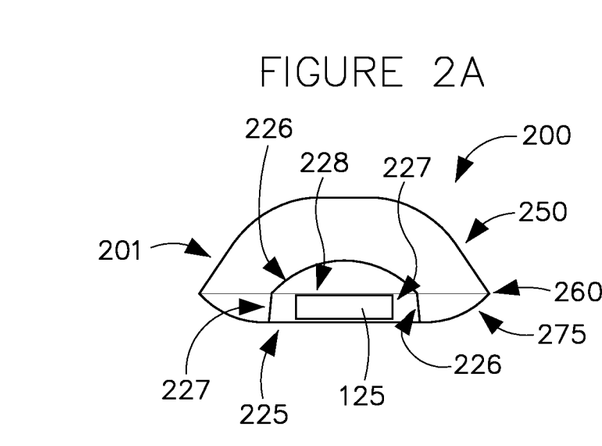
FIG. 2A illustrates a side view of a lighting system in accordance with an example embodiment of the disclosure.
Figure 2B:
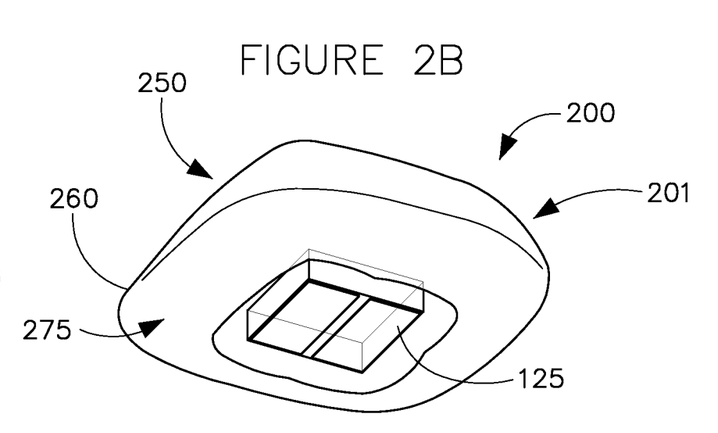
FIG. 2B illustrates a bottom perspective view of the lighting system of FIG. 2A in accordance with an example embodiment of the disclosure.
Figure 2C:
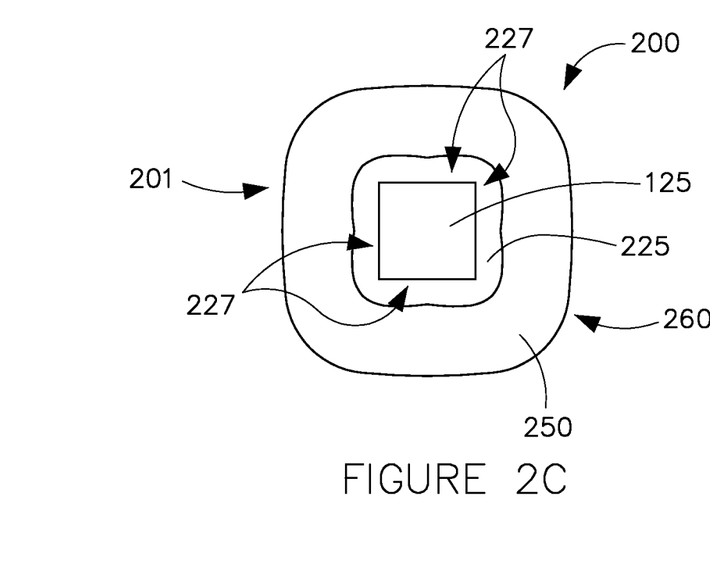
FIG. 2C illustrates a top view of the lighting system of FIG. 2A in accordance with an example embodiment of the disclosure.
Figure 2D:
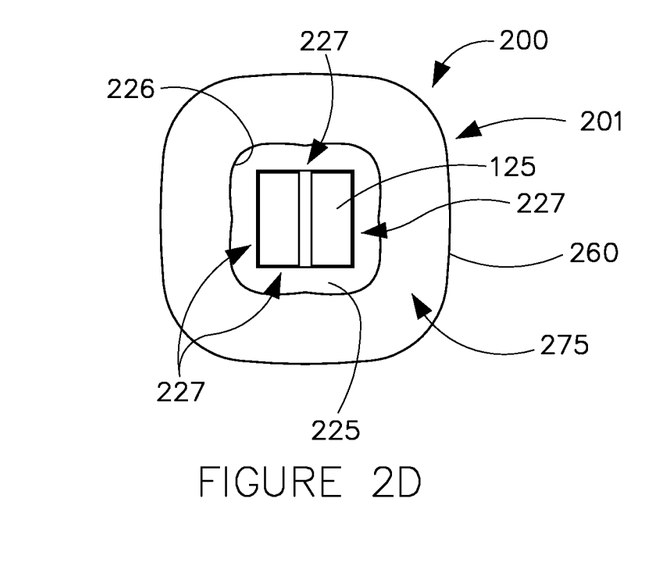
FIG. 2D illustrates a bottom view of the lighting system of FIG. 2A in accordance with an example embodiment of the disclosure.

Turning now to FIGS. 2A, 2B, 2C, and 2D (collectively FIG. 2), four views of a lighting system 200 are illustrated in accordance with some example embodiments of the disclosure. FIG. 2A illustrates a side view of the lighting system 200, FIG. 2B illustrates a perspective view of the lighting system 200 from below, FIG. 2C illustrates a top view of the lighting system 200, and FIG. 2D illustrates a bottom view of the lighting system 200.

The illustrated lighting system 200 comprises an optic 201 and a chip scale package light emitting diode 125. The optic 201 can be characterized as a button optic in some example embodiments, without limitation. Mounting the optic 201 over one of the chip scale package light emitting diodes 125 illustrated in FIG. 1, for example, can form the lighting system 200. Thus, multiple instances of the optic 201 can be mounted to the substrate 150 so as to receive and process light from each of the chip scale package light emitting diodes 125. (For visualization purposes, the substrate 150 is not shown in FIG. 2 or in subsequent FIGS. 3 and 4.)

In the illustrated example of FIG. 2, the example optic 201 comprises a cavity 225 in which the chip scale package light emitting diode 125 is disposed. The cavity 225 comprises an internal surface 226 that receives light emitted by the chip scale package light emitting diode 125. As illustrated in FIG. 4E and further discussed below, the chip scale package light emitting diode 125 has a cuboid shape with side faces 227 and a top face 228 that each emits light captured and processed by the optic 201 to create illumination. In the examples illustrated in FIG. 2 and FIG. 4E, the chip scale package light emitting diode 125 can have a square top face 228 and a square bottom face 229. The chip scale package light emitting diode 125 can be positioned within the cavity 225 such that a gap is present between the internal surface 226 of the optic 201 and the side faces 227 of the chip scale package light emitting diode 125.

The exterior of the illustrated optic 201 of FIG. 2 comprises a lower peripheral surface 275 that is undercut and an upper surface 250, both of which can be characterized as beveled. The upper surface 250 and the lower peripheral surface 275 meet to form a corner or edge 260 that extends about the cavity 225 and the chip scale package light emitting diode 125. The lower peripheral surface 275 that surrounds the cavity 225 can be a convex surface. The lower peripheral surface 275 can further be totally internally reflective with respect to at least some portion of light emitted from the side faces 227 of the chip scale package light emitting diode 125, as incident after the emitted light passes through the internal surface 226 of the cavity 225.

In some example embodiments, the upper surface 250 of the optic 201 can be viewed as a table having a beveled perimeter that forms a crown; the lower peripheral surface 275 of the optic 201 can be viewed as a pavilion; and the edge 260 of the optic 201 can be viewed as a girdle, where the pavilion and the crown meet.

Relative to a bare chip scale package light emitting diode 125 (as illustrated in FIG. 1), the lighting system 200 illustrated in FIG. 1 can provide improved illumination, for example enhancing diffusion of emitted light.

Figure 3A:
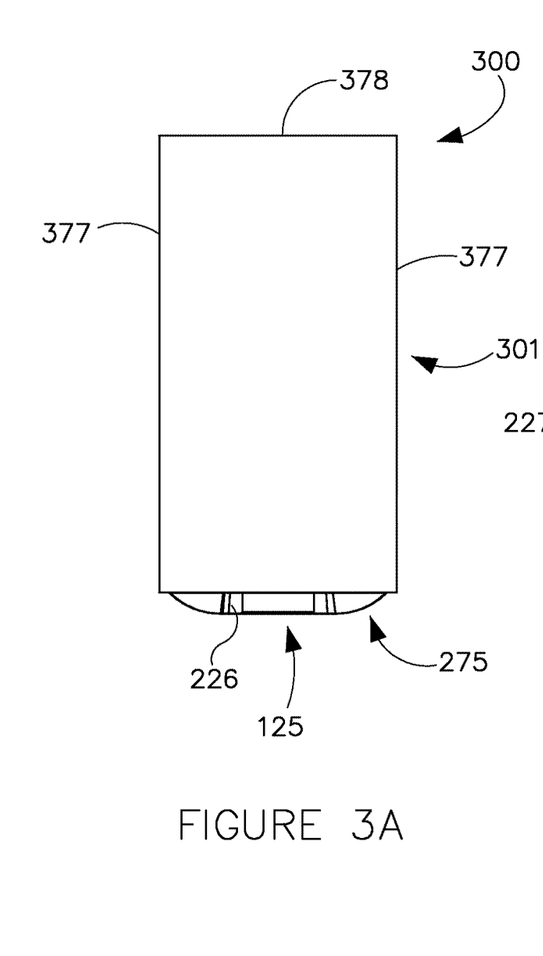
FIG. 3A illustrates a side view of a lighting system in accordance with an example embodiment of the disclosure.
Figure 3B:
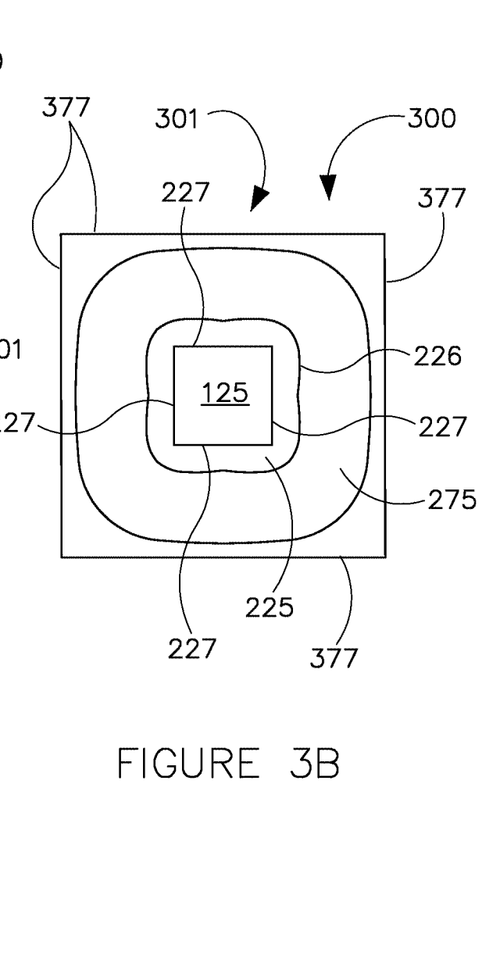
FIG. 3B illustrates a bottom view of the lighting system of FIG. 3A in accordance with an example embodiment of the disclosure.
Figure 3C:
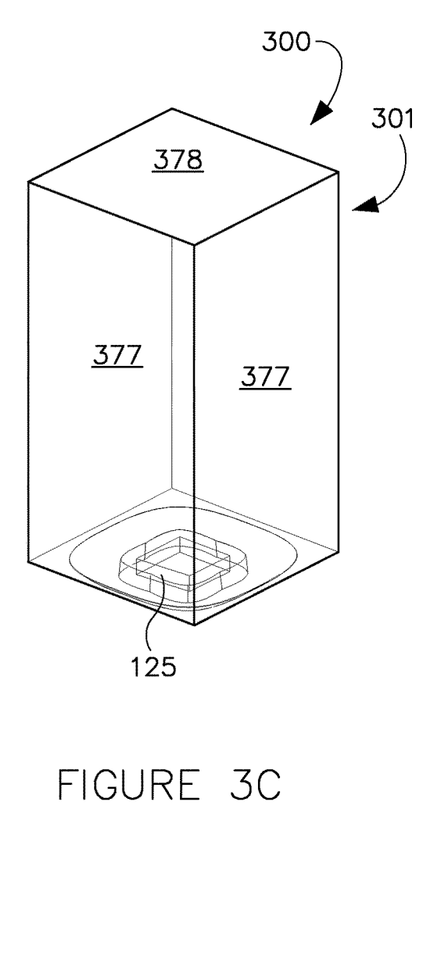
FIG. 3C illustrates a top perspective view of the lighting system of FIG. 3A in accordance with an example embodiment of the disclosure.

Turning now to FIGS. 3A, 3B, and 3C (collectively FIG. 3), three views of a lighting system 300 are illustrated in accordance with some example embodiments of the disclosure. FIG. 3A illustrates a side view of the lighting system 300, FIG. 3B illustrates a bottom view of the lighting system 300, and FIG. 3C illustrates a top perspective view of the lighting system 300.

The example lighting system 300 illustrated in FIG. 3 comprises an optic 301 and a chip scale package light emitting diode 125 disposed in a cavity 225 of the optic 301. As illustrated, the optic 301 comprises internally reflective flat optic sides 377 that guide light towards a top surface 378 through which light exits the lighting system 300. The optic 301 can be characterized as comprising a mixing rod in some example embodiments, without limitation. In some example embodiments, the top surface 378 can be patterned with refractive features for diffusing the emitted light.

The optic 301 has a lower side that is oriented towards the substrate 150 illustrated in FIG. 1 when the optic 301 is mounted to the substrate 150. The lower side of the optic 301 comprises a lower peripheral surface 275 that corresponds to the lower peripheral surface 275 illustrated in FIG. 2 and discussed above. Light emitted from the sides faces 227 of the chip scale package light emitting diode 125 can pass through the internal surface 226 of the cavity 225 and be totally internally reflected upon incidence at the lower peripheral surface 275. The totally internally reflected light can be directed to the optic sides 377 of the optic 301, which can itself totally internally reflect that light towards the top surface 378 of the optic 301. In some example embodiments, the cavities 225, the internal surfaces 226 of the cavities 225, and the lower peripheral surfaces 275 of the optics 201 and 301 illustrated in FIGS. 2 and 3 can have like contours or forms or be designed and made according to a common specification.

Figure 4A:
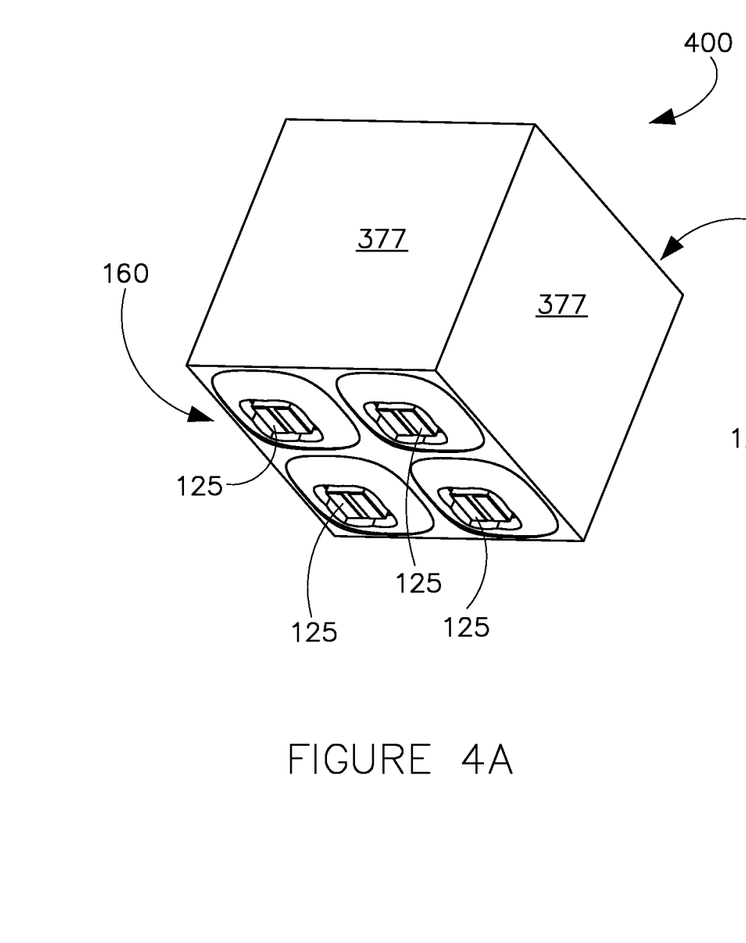
FIG. 4A illustrates an opaque bottom perspective view of a lighting system in accordance with an example embodiment of the disclosure.
Figure 4B:
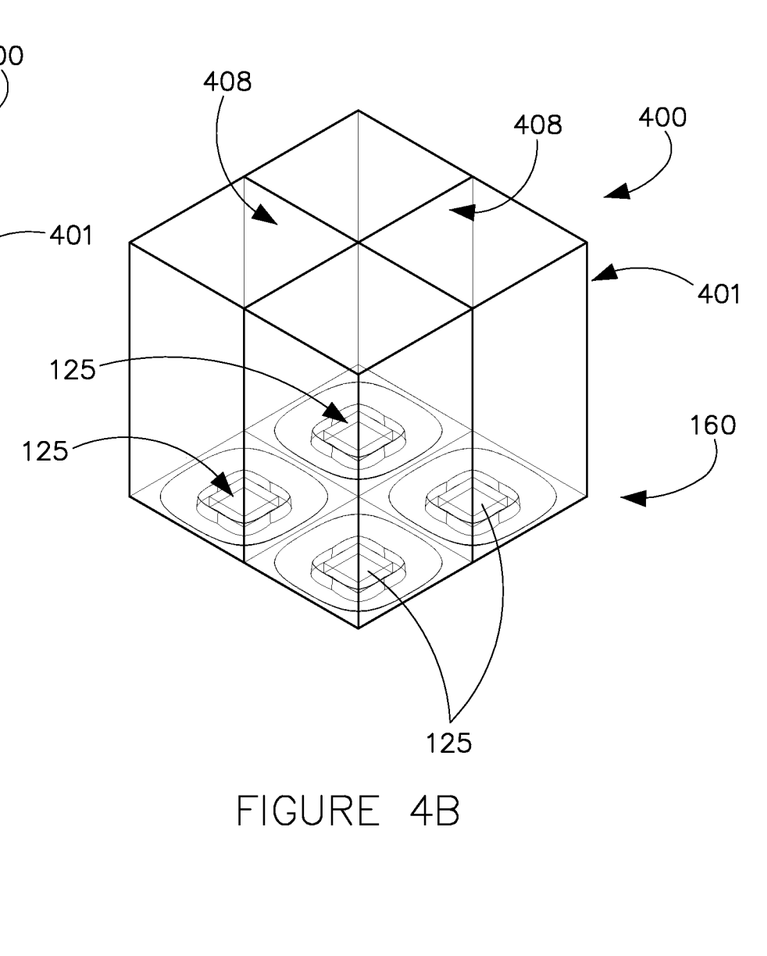
FIG. 4B illustrates a transparent top perspective view of the lighting system of FIG. 4A in accordance with an example embodiment of the disclosure.
Figure 4C:
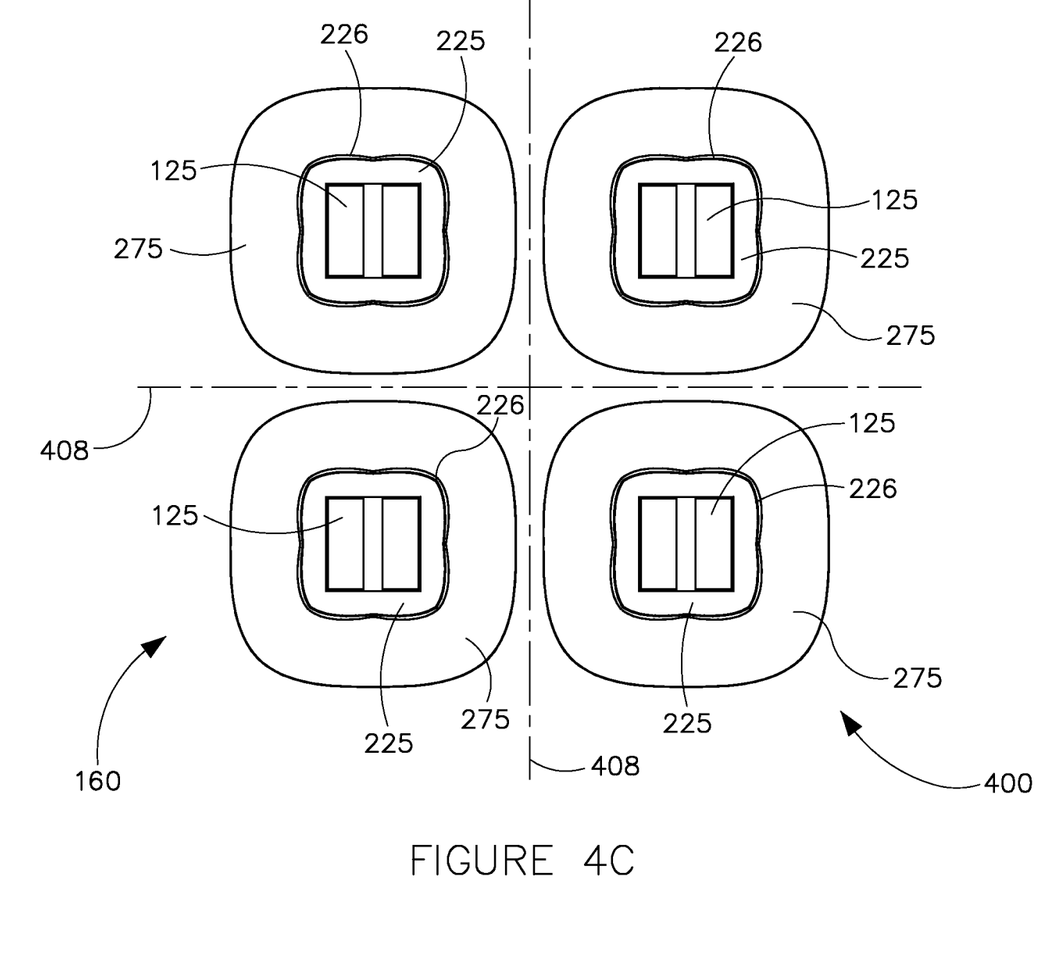
FIG. 4C illustrates a bottom view of the lighting system of FIG. 4A in accordance with an example embodiment of the disclosure.
Figures 4D, 4E:
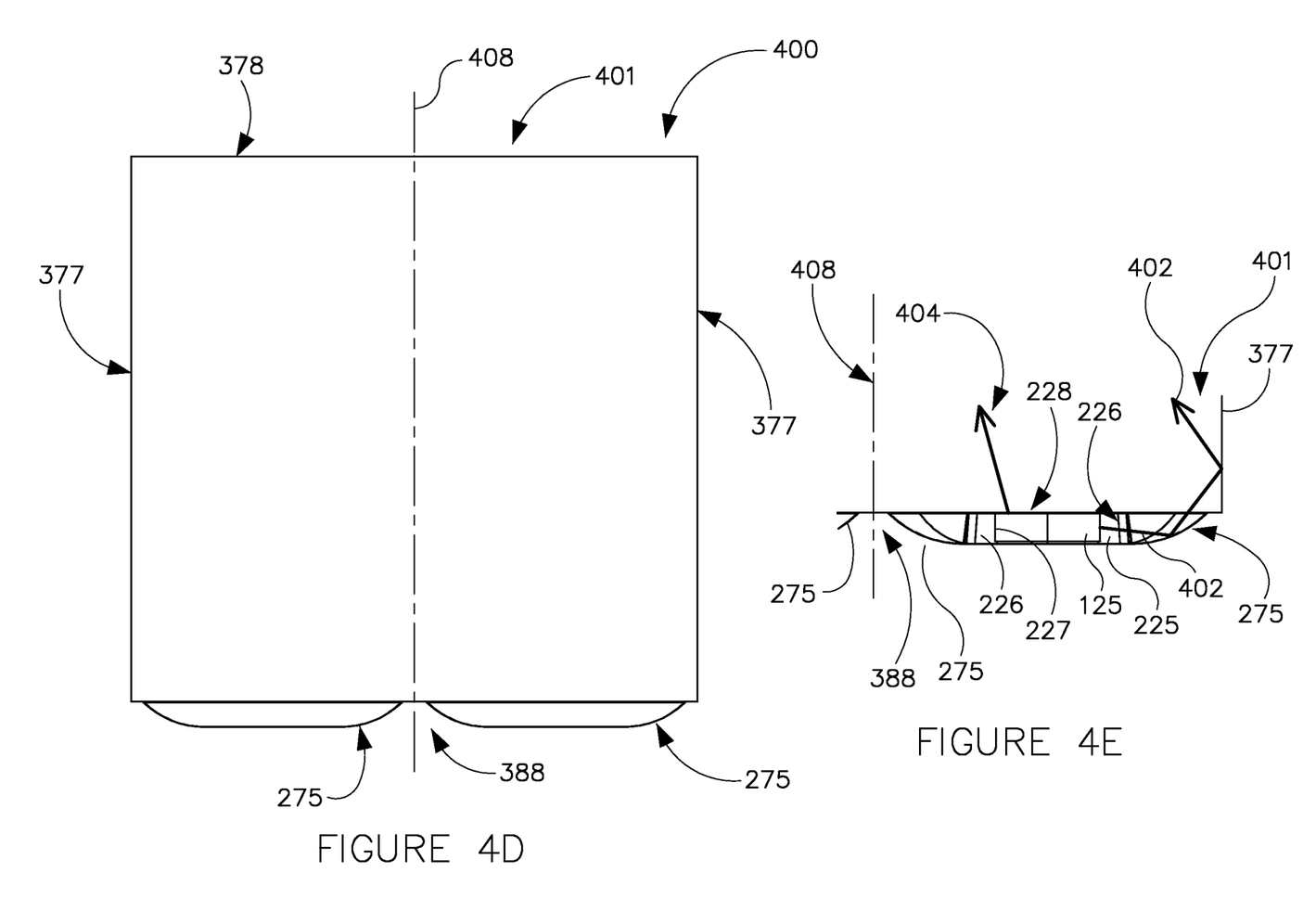
FIG. 4D illustrates a side view of the lighting system of FIG. 4A in accordance with an example embodiment of the disclosure.
FIG. 4E illustrates a magnified side view of the lighting system of FIG. 4A in accordance with an example embodiment of the disclosure.

Turning now to FIGS. 4A, 4B, 4C, 4D, and 4E (collectively FIG. 4), five views of a lighting system 400 are illustrated in accordance with some example embodiments of the disclosure. FIG. 4A illustrates an opaque perspective view of the lighting system 400, FIG. 4B illustrates a transparent top perspective view of the lighting system 400, FIG. 4C illustrates a bottom view of the lighting system 400, FIG. 4D illustrates a side view of the lighting system 400, and FIG. 4E illustrates a magnified side view of a lower portion of the lighting system 400.

In the illustrated embodiment, the lighting system 400 comprises an optic 401 that comprises four cavities 225, each accommodating a respective chip scale package light emitting diode 125. As illustrated, the optic 401 combines, processes, and homogenizes light from the array 160 of four chip scale package light emitting diodes 125, which is depicted in FIG. 1 and discussed above. Other embodiments of the optic 401 can accommodate larger or smaller arrays of chip scale package light emitting diodes 125. For example, in one such embodiment, the optic 401 can comprise five cavities 225 arranged to receive light from the array 155 of five chip scale package light emitting diodes 125 that FIG. 1 illustrates as discussed above.

FIG. 4E illustrates a detail view of the cavity 225 and adjacent features of the optic 401 overlaid with two representative ray traces 404, 402. The representative ray 404 emits from the top face 228 of the chip scale package light emitting diode 125 and is totally internally reflected by one or more of the sides 377 of the optic 401. The optic sides 377 thus guide the light out of the top side 378 of the optic 401. The representative ray 402 emits from a side face 227 of the chip scale package light emitting diode 125 and passes into the optic 401 through the internal surface 226 of the cavity 225. The ray 402 is then incident upon and totally internally reflected by the lower peripheral surface 275 of the optic 401. The lower peripheral surface 275 directs the representative ray 402 to the side 377 of the optic 401, which totally internally reflects the ray 402 for emission from the top side 378 of the optic 401 to provide illumination. The previous descriptions of the features shown in FIGS. 1 and 2 can apply to the features with common reference numbers shown in FIG. 4 and will not be repeated.

During propagation towards the top side 378 of the optic 401, the rays 402, 404 mix with other rays (not illustrated) from the other chip scale package light emitting diodes 125 in the array 160. As best seen in FIGS. 4D and 4E, the optic 401 comprises channels 388 that extend between adjacent cavities 225 and adjacent chip scale package light emitting diodes 125. The channels 388 are formed between the lower peripheral surfaces 275 and thus have totally internally reflective sides that suppress crosstalk or mixing of light outside the optic 401 and between adjacent chip scale package light emitting diodes 125.

In one example embodiment, the optic 401 is formed from four of the optics 301 illustrated in FIG. 3 as discussed above. The four optics 301 can be fused or bonded together along the reference planes 408 illustrated in FIGS. 4B, 4C, and 4D. For example, each optic 301 can be molded from acrylic and then fused together with heat or an appropriate adhesive agent to form the optic 401.

In another example embodiment, the optic 401 is formed from a unitary piece of optical material, such as acrylic, using a molding process or other appropriate fabrication technology. Accordingly the optic 401 can be seamless. In some examples of such an embodiment, the reference planes 408 can indicate planes of symmetry.

Many modifications and other embodiments of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of this application. Although specific terms are employed herein, they are used in a generic and descriptive sense only and not for purposes of limitation.

What is claimed is:

1. A lighting system comprising:
   a two-dimensional array of light emitting diodes mounted to a substrate, wherein each of the light emitting diodes has a cuboid shape comprising six faces; and
   an optic that comprises a two-dimensional array of cavities and that is mounted to the substrate with each light emitting diode disposed in a respective one of the cavities, wherein the optic comprises:
   a flat upper surface oriented away from the substrate;
   a lower surface oriented towards the substrate;
   four flat side optic faces that extend from the flat upper surface towards the lower surface, and
   wherein, associated with each cavity of the two-dimensional array of cavities is:
   a first portion of the lower surface extending peripherally around the cavity and adjoining the substrate, and
   a second portion of the lower surface rising from the first portion of the lower surface and meeting at least one of the four flat side optic faces at a corner of the optic.

2. The lighting system of claim 1, wherein the optic is configured to capture light emitted from at least five of the six faces.

3. The lighting system of claim 1, wherein each of the light emitting diodes comprises:
   a bottom side oriented towards the substrate;
   a top side oriented away from the substrate; and four sides extending between the bottom side and the top side, wherein the top side and the four sides of each of the light emitting diodes emit light that the optic captures, and wherein the optic is operable to homogenize the captured light from the light emitting diodes.

4. The lighting system of claim 3, wherein the four flat side optic faces are totally internally reflective with respect to the captured light and guide the captured light to the flat upper surface.

5. The lighting system of claim 4, wherein the flat upper surface comprises a diffusing surface.

6. The lighting system of claim 1, wherein the second portion of the lower surface is oriented to receive light from one of the sides of the light emitting diodes and to internally reflect the received light and to direct internally reflected light to an adjoining one of the four flat side optic faces.

7. The lighting system of claim 6, wherein the adjoining one of the four flat side optic faces is oriented to direct to the flat upper surface the internally reflected light received from the second portion of the lower surface.

8. The lighting system of claim 1, wherein the two-dimensional array of light emitting diodes comprises chip scale packages of light emitting diodes.

9. The lighting system of claim 1, wherein channels formed in the optic extend between adjacent ones of the cavities to suppress crosstalk between adjacent ones of the light emitting diodes respectively disposed in the adjacent ones of the cavities.

10. The lighting system of claim 1, wherein the optic comprises a mixing rod, and wherein the substrate comprises a white circuit board.

11. The lighting system of claim 1, wherein the optic is formed as a unitary piece of optical material.

12. A lighting system comprising:

a substrate that comprises electrical paths;

a chip scale package (CSP) light emitting diode that is mounted to the substrate, that is connected to the electrical paths, and that comprises:

a bottom face oriented towards the substrate;

a top face that is oriented away from the substrate and that is operative to emit light; and four side faces that extend between the top face and the bottom face and that are operative to emit light; and an optic that is mounted to the substrate and that comprises:

a flat upper surface oriented away from the substrate;

a lower surface oriented towards the substrate;

a cavity that is formed in the lower surface, wherein the CSP light emitting diode is at least partially disposed in the cavity; and four flat side optic faces that extend from the flat upper surface towards the lower surface, wherein a first portion of the lower surface adjoins the substrate and extends peripherally around the cavity, and wherein a second portion of the lower surface rises from the first portion of the lower surface and meets the four flat side faces in a corner that extends peripherally around the cavity.

13. The lighting system of claim 12, wherein the CSP light emitting diode is one of an array of CSP light emitting diodes mounted to the substrate, wherein the substrate comprises a white surface, and wherein the optic comprises a mixing rod.

14. The lighting system of claim 12, wherein the second portion of the lower surface is totally internally reflective with respect to rays of light emitting from the four side faces of the CSP light emitting diode, wherein the four flat side optic faces are operative to guide light to the flat upper surface of the optic via total internal reflection, and wherein the flat upper surface of the optic comprises a diffusing surface.

* * * * *